(12) United States Patent
Onodera

(10) Patent No.: US 7,760,315 B2
(45) Date of Patent: Jul. 20, 2010

(54) ELECTROOPTICAL DEVICE, MOUNTING ASSEMBLY, METHOD FOR PRODUCING ELECTROOPTICAL DEVICE, AND ELECTRONIC APPARATUS

(75) Inventor: Hiroyuki Onodera, Matsumoto (JP)

(73) Assignee: Epson Imaging Devices Corporation (JP)

( * ) Notice: Subject to any disclaimer, the term of this patent is extended or adjusted under 35 U.S.C. 154(b) by 671 days.

(21) Appl. No.: 11/611,278

(22) Filed: Dec. 15, 2006

(65) Prior Publication Data

US 2007/0138509 A1    Jun. 21, 2007

(30) Foreign Application Priority Data

Dec. 15, 2005 (JP) ............................. 2005-361378
Mar. 29, 2006 (JP) ............................. 2006-090368
Nov. 22, 2006 (JP) ............................. 2006-315178

(51) Int. Cl.
*G02F 1/1345* (2006.01)
(52) U.S. Cl. ...................................... 349/149; 349/152
(58) Field of Classification Search ................... None
See application file for complete search history.

(56) References Cited

U.S. PATENT DOCUMENTS 6,226,060 B1 * 5/2001 Onisawa et al. ............... 349/43
6,476,505 B2 * 11/2002 Nakamura ................... 257/786
6,507,384 B1 * 1/2003 Endo et al. .................. 349/149

OTHER PUBLICATIONS

Abstract of JP 2002196703A publication date Jul. 12, 2002 Kasai Masanori et al.
Abstract of JP 2004-212587A publication date Jul. 29, 2004 Takano Daijuro et al.
Abstract of JP 2005-099310A publication date Apr. 14, 2005 Furuhata Hiraoki et al.

* cited by examiner

*Primary Examiner*—David Nelms
*Assistant Examiner*—Lucy P Chien
(74) *Attorney, Agent, or Firm*—Lowe Hauptman Ham & Berner, LLP

(57) ABSTRACT

An electrooptical device includes a substrate and an electronic component mounted on the substrate with an adhesive. The substrate has terminals arranged thereon and wiring lines connected to the terminals and extending in a column direction. The terminals are divided into at least one first terminal group and at least one second terminal group that does not overlap the first terminal group in the column direction. The terminals of the first terminal group are shifted from each other in a row direction so that the adjacent terminals overlap each other in the column direction. The terminals of the second terminal group are shifted from each other in the row direction so that the adjacent terminals overlap each other in the column direction.

13 Claims, 11 Drawing Sheets

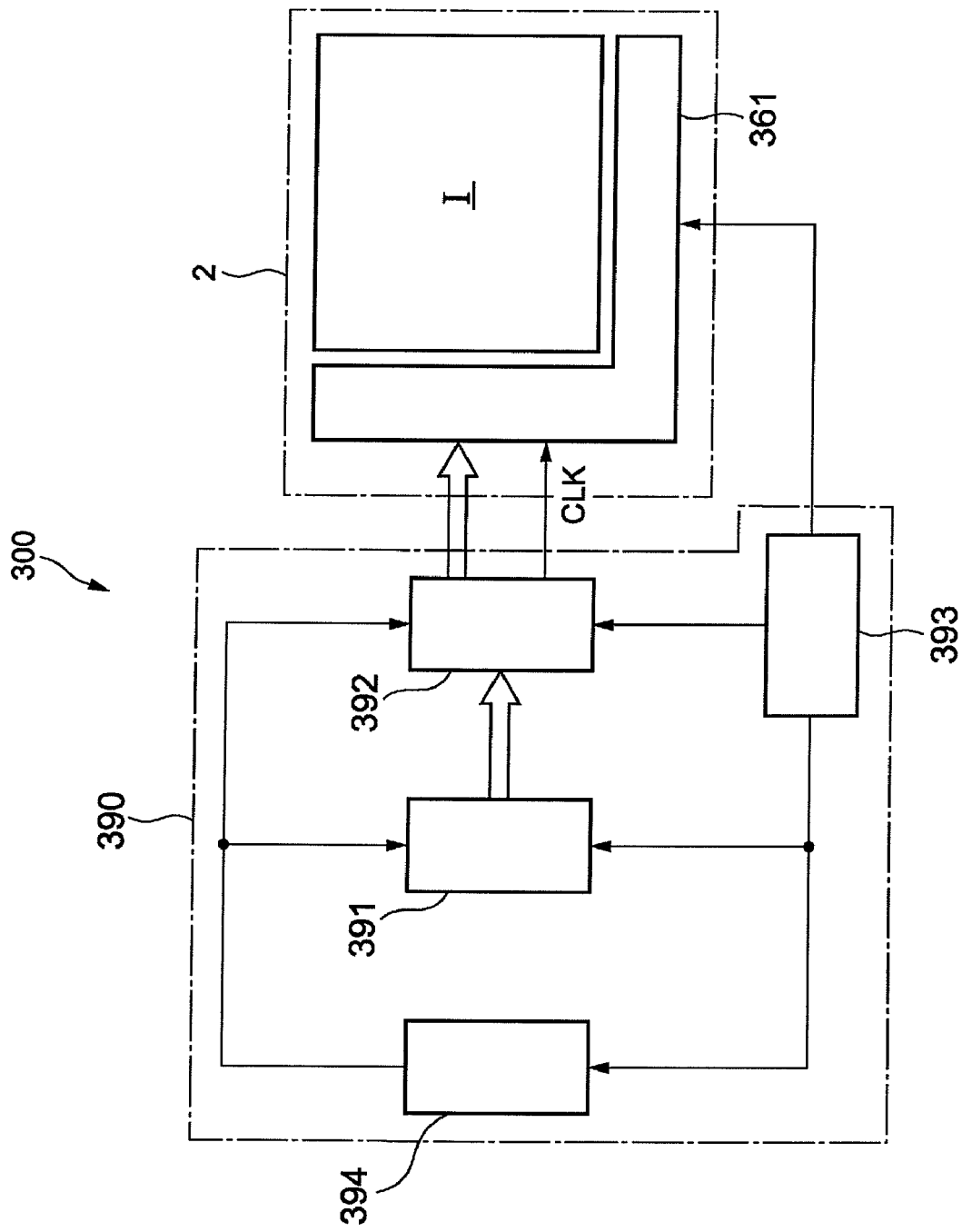

ELECTROOPTICAL DEVICE, MOUNTING ASSEMBLY, METHOD FOR PRODUCING ELECTROOPTICAL DEVICE, AND ELECTRONIC APPARATUS

RELATED APPLICATIONS

The present application is based on, and claims priority from Japanese Patent Application Number 2005-361378, filed Dec. 15, 2005, and Japanese Patent Application Numbers 2006-090368, filed Mar. 29, 2006 and 2006-315178, filed Nov. 22, 2006 the disclosure of which are hereby incorporated by reference herein in its entirety.

BACKGROUND

1. Technical Field

The present invention relates to electrooptical devices, mounting assemblies, methods for producing the electrooptical devices, and electronic apparatuses including the electrooptical devices, such as personal computers and cellular phones.

2. Related Art

Liquid crystal displays are often used as display units for electronic apparatuses such as personal computers and cellular phones. These displays include, for example, a liquid crystal panel including two opposing substrates and a liquid crystal sealed therebetween. Input/output pads, for example, are provided on the substrates and connected to input/output bumps of driver integrated circuits (ICs). For example, JP-A-2005-99310 discloses a technique for increasing the numbers of input/output pads and input/output bumps without impairing connection reliability (see paragraph [0031] and FIG. 3 of this publication). According to this technique, for example, rows of output pads are arranged in a region of a substrate where a driver IC is to be mounted in a column direction perpendicular to a row direction. Wiring lines passing between the output pads of the first row are obliquely extended to the output pads of the second row.

This technique, however, has the problem that the wiring lines are difficult to extend to the output pads if the number of output pads is further increased by increasing the number of rows of the output pads (for example, to three rows).

For example, more space is required to connect the wiring lines passing between the adjacent output pads of the first row to the output pads of the second row by obliquely extending the wiring lines in the row direction.

The driver IC is bonded to the substrate with, for example, an anisotropic conductive film (ACF). The ACF is squeezed when the driver IC is pressed against the substrate. In the technique described above, the flowability of the ACF undesirably decreases as the number of rows of the output pads is increased, depending on the positions of the output pads.

SUMMARY

An advantage of some aspects of the invention is that they provide an electrooptical device that facilitates extension of wiring lines connected to terminals and allows an adhesive to flow smoothly when an electronic component is pressed, and also provide a mounting assembly, a method for producing the electrooptical device, and an electronic apparatus.

An electrooptical device according to a first aspect of the invention includes a substrate and an electronic component mounted on the substrate with an adhesive. The substrate has terminals arranged thereon and wiring lines connected to the terminals and extending in a column direction. The terminals are divided into at least one first terminal group and at least one second terminal group that does not overlap the first terminal group in the column direction. The terminals of the first terminal group are shifted from each other in a row direction so that the adjacent terminals overlap each other in the column direction. The terminals of the second terminal group are shifted from each other in the row direction so that the adjacent terminals overlap each other in the column direction.

That is, the adjacent terminals of each of the first and second terminal groups are shifted from each other in the row direction so that the ranges of the adjacent terminals in the row direction overlap each other on a line extending in the column direction from the ranges of the adjacent terminals in the row direction. In addition, the first and second terminal groups are separated from each other in the row direction so that the terminals of the second terminal group are not positioned on a line extending in the column direction from the ranges of the terminals of the first terminal group in the row direction.

According to the first aspect of the invention, the terminals of the first terminal group are shifted from each other in the row direction so that the adjacent terminals overlap each other in the column direction, and the terminals of the second terminal group are shifted from each other in the row direction so that the adjacent terminals overlap each other in the column direction. This arrangement can facilitate the extension of the wiring lines, reduce the space required therefor in the row direction (and the column direction), and provide, for example, a path through which the adhesive flows in a direction along the terminals of the first terminal group. In addition, the second terminal group does not overlap the first terminal group in the column direction. This arrangement can further provide, for example, a path through which the adhesive flows in the column direction in a gap between the first terminal group and the second terminal group.

Preferably, the wiring lines connected to the terminals of the first terminal group in second and subsequent rows extend between the terminal of the first terminal group in a first row and the terminal of the second terminal group in the first row. If, for example, the terminals are arranged in the row direction, the wiring lines connected to the terminals in the second and subsequent rows can be easily extended in the same direction (for example, in the column direction) between the terminal of the first terminal group in the first row and the terminal of the second terminal group in the first row.

Preferably, the electrooptical device satisfies the following relationship:

$$d \geq (N-1) \times Z2 + N \times Z1$$

wherein Z1 is an interval between the wiring lines connected to the terminals of the first terminal group in the first and second rows; Z2 is the width of the wiring lines; N is the number of the terminals of the first terminal group; and d is an interval between the terminal of the first terminal group in the first row and the terminal of the second terminal group in the first row. In this case, for example, the wiring lines can be easily arranged such that the amount of shift of the terminal of the first terminal group in the Nth row from the terminal of the first terminal group in the (N−1)th row decreases as the number of the terminals of the first terminal group, namely N, increases. This arrangement can reliably provide intervals between the terminals and the wiring lines.

If, for example, the wiring lines of the first terminal group are arranged at substantially regular intervals in the row direction, the terminals and the wiring lines can be prevented from obstructing the flow of the adhesive when the electronic component is pressed against the substrate with the adhesive disposed therebetween. This arrangement allows the adhesive to flow smoothly, thus enhancing electrical connection between, for example, terminals of the electronic component and the terminals of the substrate.

If the width Z2 of the wiring lines is different from the interval Z1, for example, smaller than the interval Z1, a larger number of terminals can be arranged in the row direction than in the case where the interval Z1 and the width Z2 are equal. Thus, the invention can also be applied to the case where the width Z2 is different from the interval Z1.

Preferably, Z1 and Z2 are equal, and the electrooptical device satisfies the following relationship:

$$s=2d/(2N-1)$$

wherein s is the amount of shift of the terminal of the first terminal group in the second row from the terminal of the first terminal group in the first row. In this case, for example, the wiring lines can be arranged at intervals Z1 equal to the width Z2 of the wiring lines such that the amount of shift s of the terminal of the first terminal group in the second row from the terminal of the first terminal group in the first row decreases as the number of the terminals of the first terminal group, namely N, increases. This arrangement can, for example, reliably prevent a short circuit between the wiring lines.

Preferably, the wiring lines connected to the terminals of the first terminal group in the second and subsequent rows extend linearly in the column direction at least between the terminal of the first terminal group in the first row and the terminal of the second terminal group in the first row. In this case, for example, the length of the wiring lines can be reduced for lower resistance as compared with the case where the terminals are arranged in the row direction with the wiring lines extended obliquely with respect to the row direction. In addition, for example, the adhesive can flow smoothly in the column direction when the electronic component is pressed against the substrate with the adhesive disposed therebetween, thus enhancing connection between, for example, the terminals of the electronic component and the terminals of the substrate.

Preferably, the wiring lines connected to the terminals of the first terminal group are electrically connected to corners of the terminals of the first terminal group facing the second terminal group. In this case, for example, the wiring lines connected to the terminals of the first terminal group in the second and subsequent rows can be easily arranged with a smaller amount of shift in the row direction than in the case where the wiring lines are connected to positions different from the corners of the terminals facing the second terminal group. This arrangement can thus minimize the amount of shift.

Preferably, the electrooptical device further includes second wiring lines extending in the column direction and electrically connected to sides of the terminals opposite sides thereof where the wiring lines are electrically connected. The second wiring lines adjacent in the row direction, for example, test terminal lines, can be easily extended substantially in parallel in the column direction in the same manner as the wiring lines adjacent in the row direction. This arrangement can prevent, for example, a short circuit between the adjacent second wiring lines.

A mounting assembly according to a second aspect of the invention includes an electrooptical device including a substrate and an electronic component mounted on the substrate with an adhesive. The substrate has terminals arranged thereon and wiring lines connected to the terminals and extending in a column direction. The terminals are divided into at least one first terminal group and at least one second terminal group that does not overlap the first terminal group in the column direction. The terminals of the first terminal group are shifted from each other in a row direction so that the adjacent terminals overlap each other in the column direction. The terminals of the second terminal group are shifted from each other in the row direction so that the adjacent terminals overlap each other in the column direction.

That is, the adjacent terminals of each of the first and second terminal groups are shifted from each other in the row direction so that the ranges of the adjacent terminals in the row direction overlap each other on a line extending in the column direction from the ranges of the adjacent terminals in the row direction. In addition, the first and second terminal groups are separated from each other in the row direction so that the terminals of the second terminal group are not positioned on a line extending in the column direction from the ranges of the terminals of the first terminal group in the row direction.

According to the second aspect of the invention, the terminals of the first terminal group are shifted from each other in the row direction so that the adjacent terminals overlap each other in the column direction, and the terminals of the second terminal group are shifted from each other in the row direction so that the adjacent terminals overlap each other in the column direction. This arrangement can facilitate the extension of the wiring lines, reduce the space required therefor in the row direction (and the column direction), and provide, for example, a path through which the adhesive flows in a direction along the terminals of the first terminal group. In addition, the second terminal group does not overlap the first terminal group in the column direction. This arrangement can further provide, for example, a path through which the adhesive flows in the column direction in a gap between the first terminal group and the second terminal group.

A method for producing an electrooptical device according to a third aspect of the invention includes forming terminals on a substrate and mounting an electronic component on the substrate by pressing the electronic component against the substrate with an adhesive disposed therebetween. The terminals are divided into at least one first terminal group and at least one second terminal group that does not overlap the first terminal group in a column direction. The terminals of the first terminal group are shifted from each other in a row direction so that the adjacent terminals overlap each other in the column direction. The terminals of the second terminal group are shifted from each other in the row direction so that the adjacent terminals overlap each other in the column direction.

According to the third aspect of the invention, the terminals of the first terminal group are shifted from each other in the row direction so that the adjacent terminals overlap each other in the column direction, and the terminals of the second terminal group are shifted from each other in the row direction so that the adjacent terminals overlap each other in the column direction. This arrangement can facilitate the extension of the wiring lines, reduce the space required therefor in the row direction (and the column direction), and provide a path through which the adhesive flows in a direction along the terminals of the first terminal group. In addition, the second terminal group does not overlap the first terminal group in the column direction. This arrangement can also reliably provide a path through which the adhesive flows between the first terminal group and the second terminal group. The method according to the third aspect of the invention can therefore enhance connection between, for example, terminals of the electronic component and the terminals of the substrate.

Preferably, an interval between the wiring lines connected to the terminals of the first terminal group in the first and second rows is set to the minimum width possible by photolithography. In this case, for example, the wiring lines can be formed in a smaller mounting region of the substrate without causing short circuits by photolithography.

An electronic apparatus may include the electrooptical device described above.

This electronic apparatus can provide excellent display performance because it includes the liquid crystal device described above, which facilitates the extension of the wiring lines connected to the terminals and allows the adhesive to flow smoothly when the electronic component is pressed.

BRIEF DESCRIPTION OF THE DRAWINGS

The invention will be described with reference to the accompanying drawings, wherein like numbers reference like elements.

FIG. 11 is a block diagram of a control system of an electronic apparatus according to a third embodiment of the invention.

DESCRIPTION OF EXEMPLARY EMBODIMENTS

Figure 1:
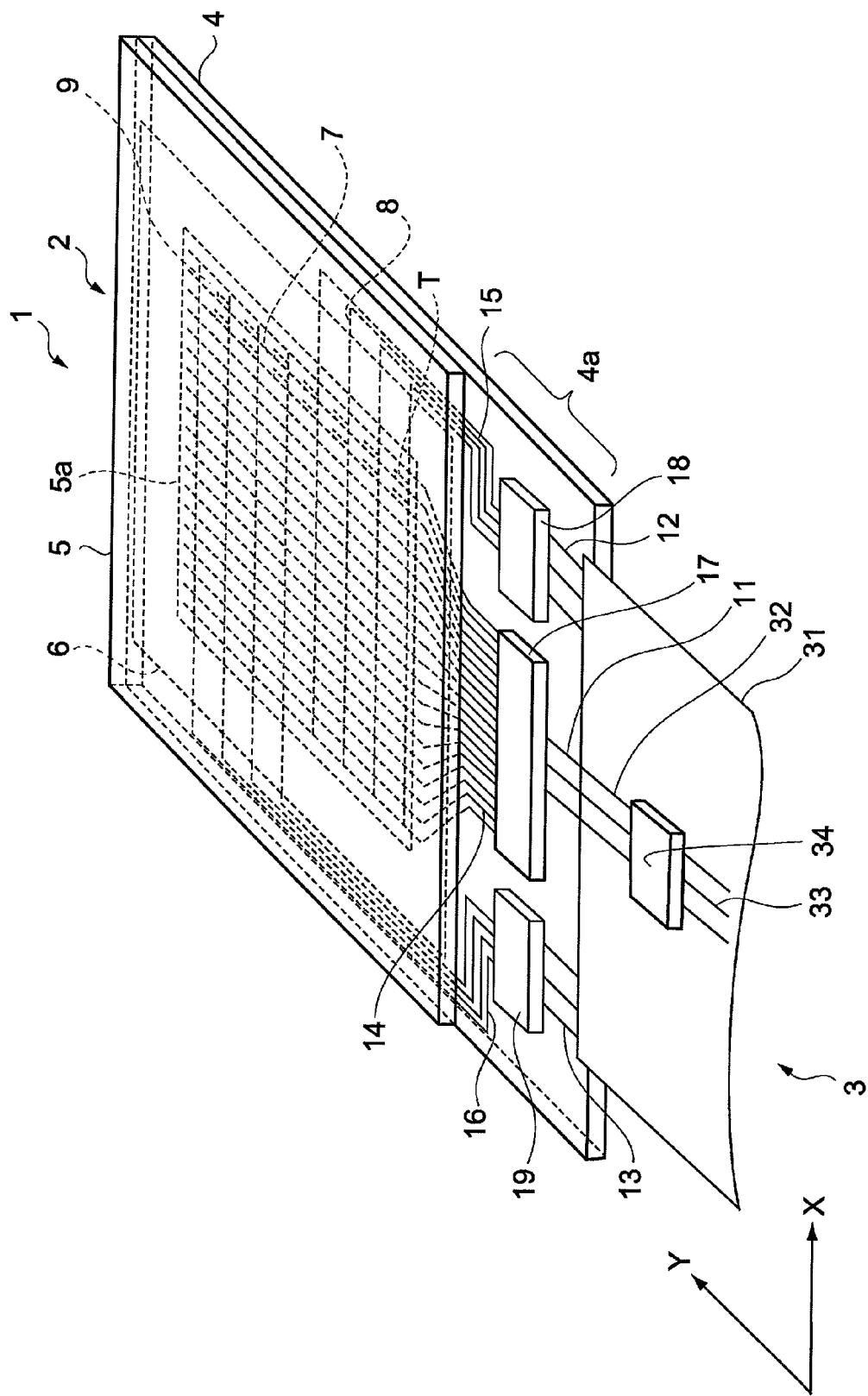
FIG. 1 is a schematic perspective view of a liquid crystal device according to a first embodiment of the invention.

Embodiments of the invention will now be described with reference to the drawings. In the embodiments below, liquid crystal devices, specifically, transflective amorphous thin-film transistor (TFT) active-matrix liquid crystal devices, will be described as an example of an electrooptical device, and electronic apparatuses including the liquid crystal devices and methods for producing the liquid crystal devices will also be described, although the invention is not limited thereto. For convenience of illustration, the numbers and scales of components of the structures illustrated in the drawings differ from those of components of actual structures.

First Embodiment

Figure 2:
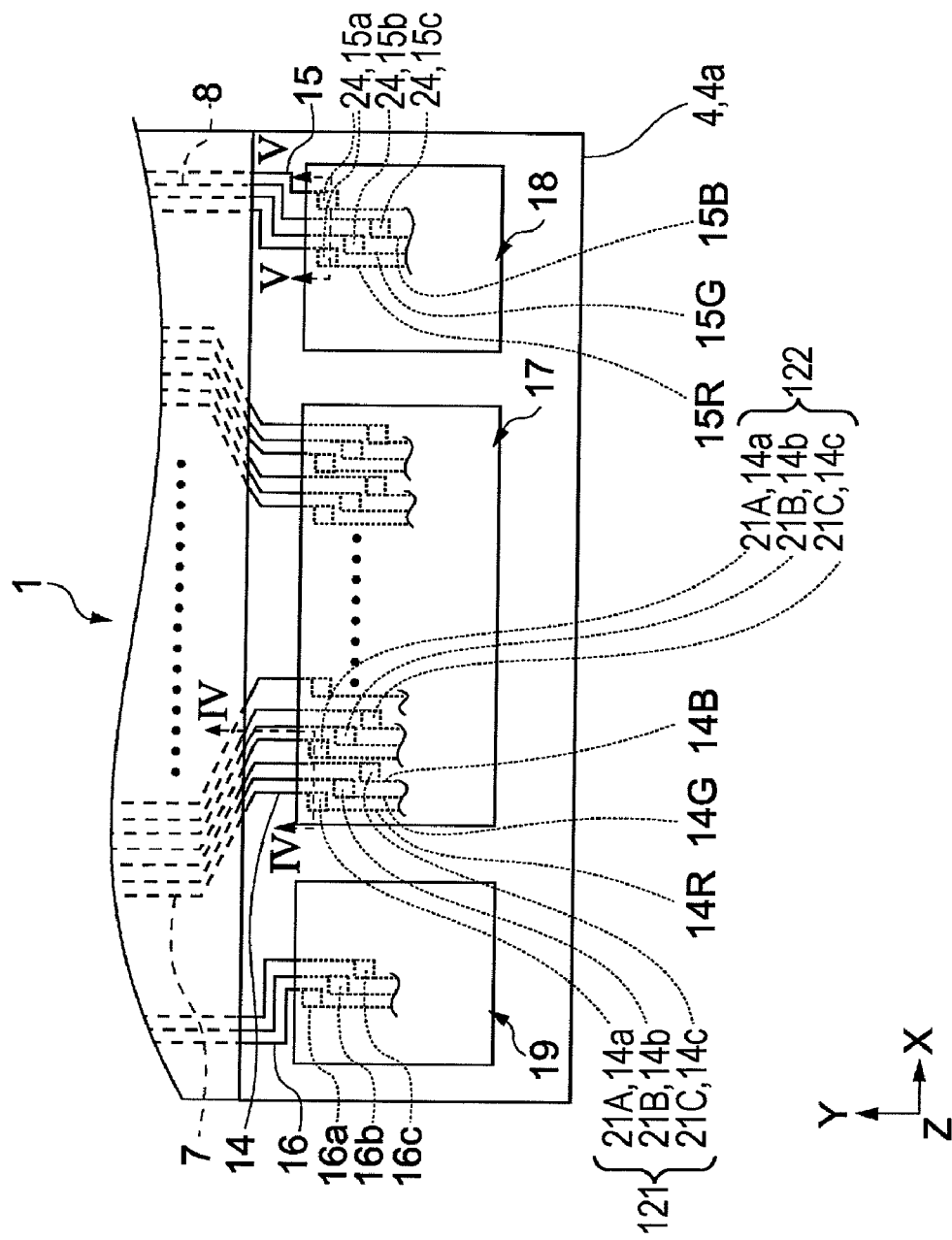
FIG. 2 is a plan view of an extended portion of the liquid crystal device in FIG. 1.
Figure 3:
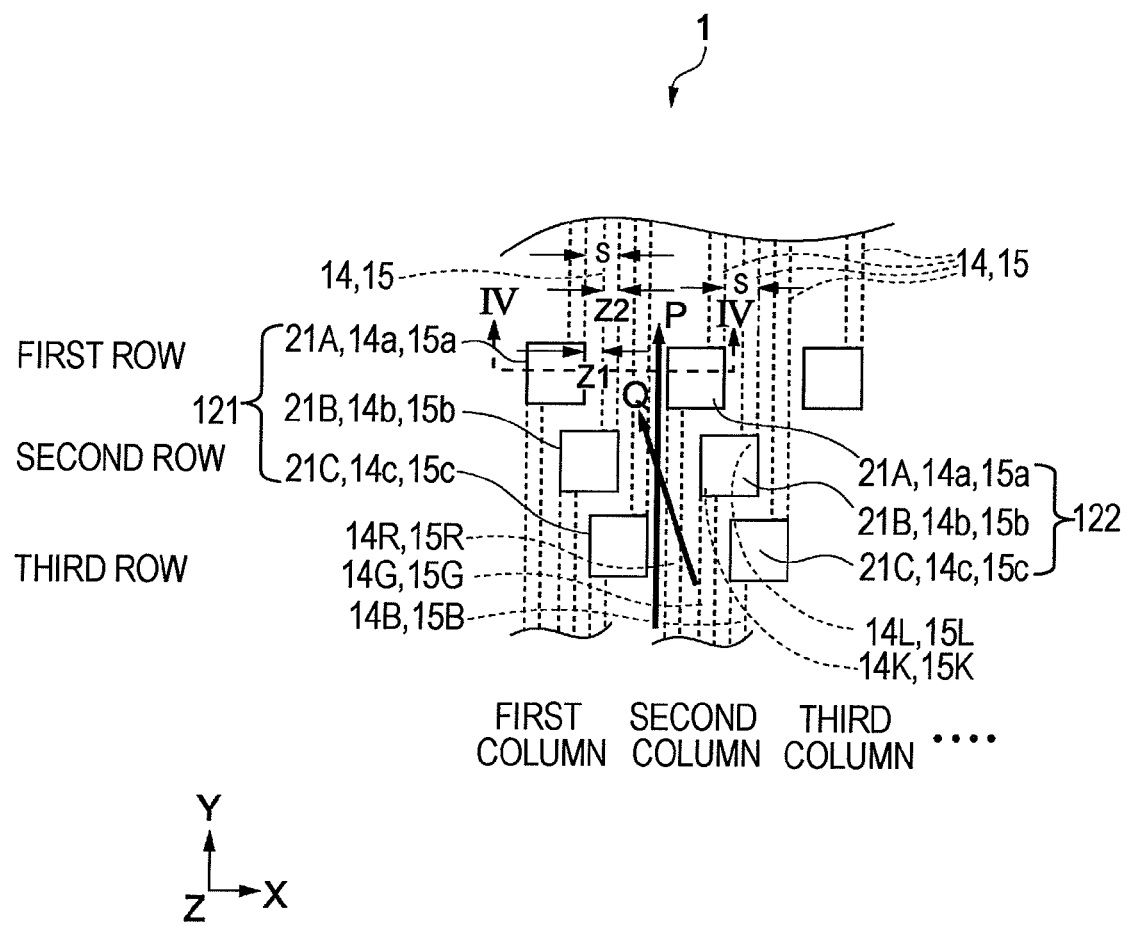
FIG. 3 is an enlarged plan view of the vicinity of output terminals of the liquid crystal device in FIG. 2.
Figure 4:
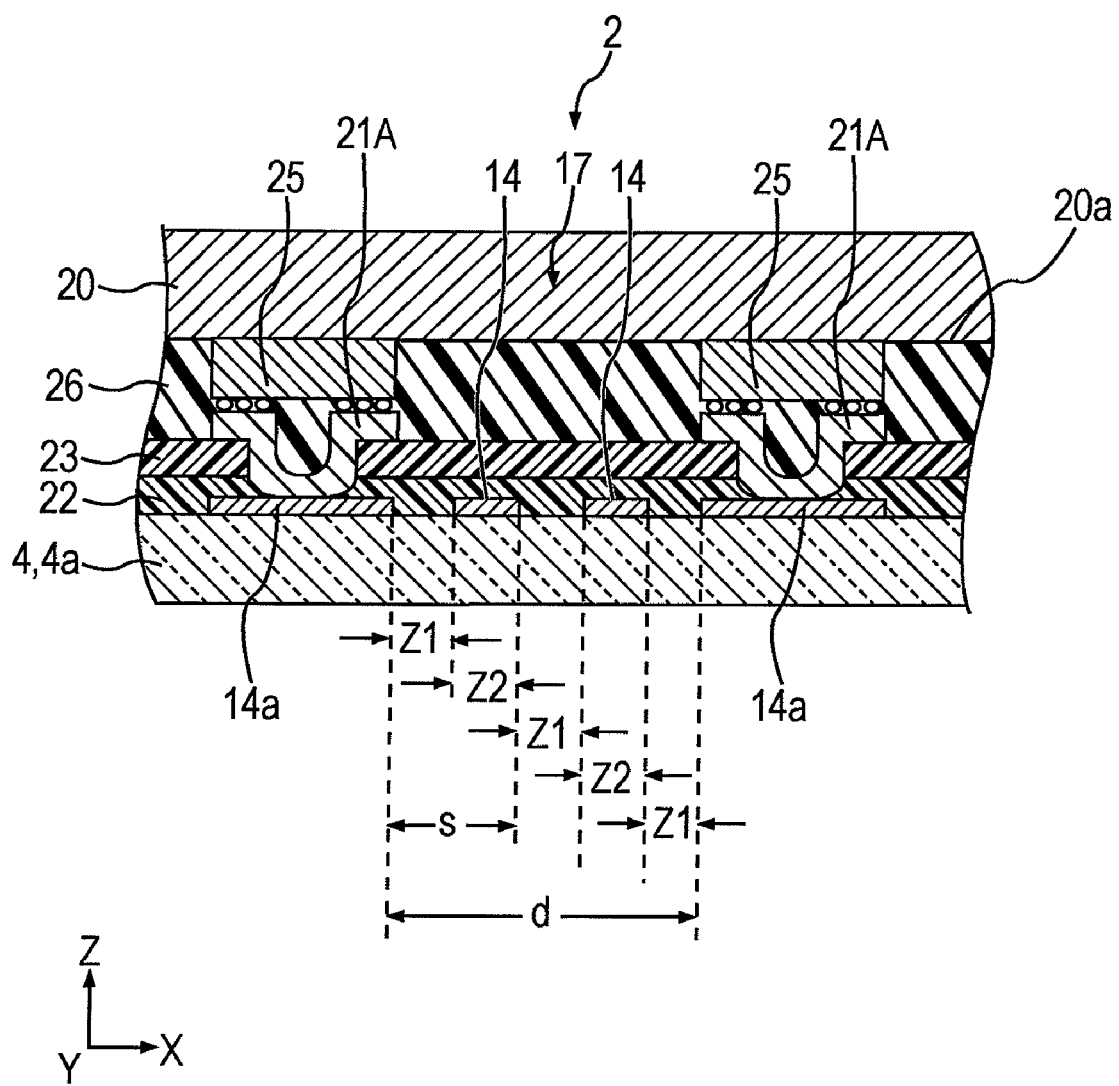
FIG. 4 is a sectional view taken along line IV-IV of FIGS. 2 and 3.
Figure 5:
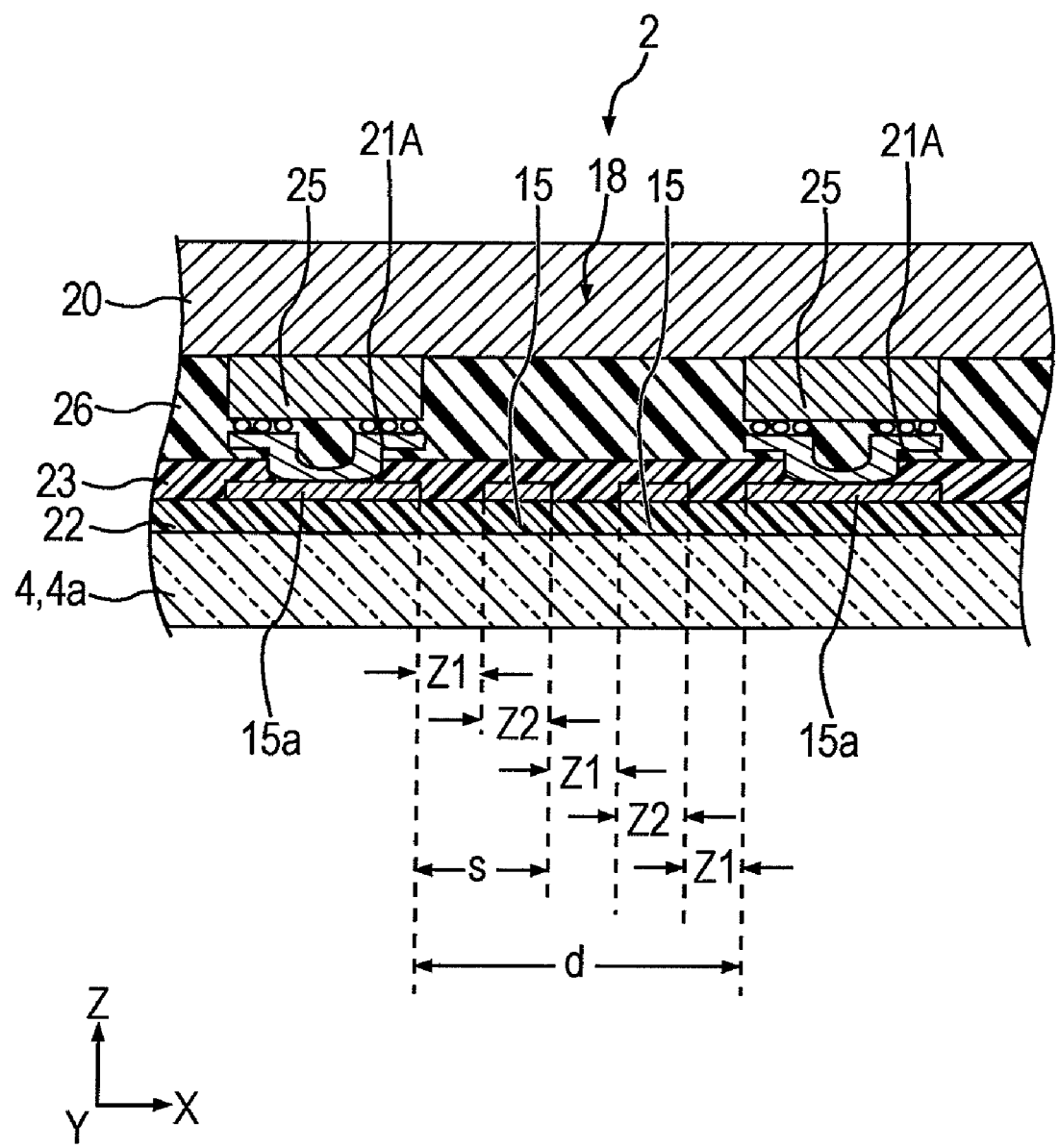
FIG. 5 is a sectional view taken along line V-V of FIG. 2.

FIG. 1 is a schematic perspective view of a liquid crystal device according to a first embodiment of the invention. FIG. 2 is a plan view of an extended portion of the liquid crystal device in FIG. 1. FIG. 3 is an enlarged plan view of the vicinity of output terminals of the liquid crystal device in FIG. 2. FIG. 4 is a sectional view taken along line IV-IV of FIGS. 2 and 3. FIG. 5 is a sectional view taken along line V-V of FIG. 2. FIG. 3 illustrates the state of the liquid crystal device before a driver IC 17, described later, is mounted thereon.

Structure of Liquid Crystal Device

A liquid crystal device 1 includes a liquid crystal panel 2 and a circuit board 3 connected thereto. The liquid crystal device 1 is optionally provided with additional components such as a frame (not shown) for supporting the liquid crystal panel 2.

The liquid crystal panel 2 includes opposing substrates 4 and 5, a seal 6 disposed therebetween, and a liquid crystal (not shown) sealed therebetween. The liquid crystal used is, for example, a twisted nematic (TN) liquid crystal.

The substrates 4 and 5 are transparent boards formed of, for example, glass or synthetic resin. The substrate 4 has gate electrodes 7, source electrodes 8, amorphous TFTs T, and pixel electrodes 9 on the liquid crystal side. The substrate 5 has a common electrode 5a on the liquid crystal side.

The gate electrodes 7 are arranged in the X direction, and the source electrodes 8 are arranged in the Y direction. The gate electrodes 7 and the source electrodes 8 are formed of, for example, a metal such as aluminum. In FIG. 1, for example, the upper half of the source electrodes 8 are extended to the left, and the lower half of the source electrodes 8 are extended to the right. The number of gate electrodes 7 and the number of source electrodes 8 may be changed according to the resolution of the liquid crystal device 1 and the size of a display region.

The TFTs T each have three terminals, each electrically connected to a corresponding one of the gate electrodes 7, a corresponding one of the source electrodes 8, or a corresponding one of the pixel electrodes 9. The TFTs T are electrically connected to the gate electrodes 7, the source electrodes 8, and the pixel electrodes 9 so that a current flows from the gate electrodes 7 to the pixel electrodes 9, or in the reverse direction, when a voltage is applied to the source electrodes 8.

In FIG. 1, the substrate 4 has an extended portion 4a extending beyond an edge of the substrate 5. Input lines 11 to 13 (omitted in FIG. 2) and output lines 14 to 16 are provided on a surface of the extended portion 4a, and driver ICs 17 to 19, for example, are mounted thereon to drive the liquid crystal.

In FIG. 1, the input lines 11 are arranged in the direction in which the gate electrodes 7 are arranged, that is, the X direction, which is perpendicular to the Y direction. Ends of the input lines 11 facing the driver IC 17, described later, are electrically connected to driver input terminals of the driver IC 17 (not shown). Ends of the input lines 11 facing the circuit board 3 are electrically connected to output lines 32 provided on a flexible base 31 of the circuit board 3 with, for example, an ACF (not shown). Ends of the input lines 12 facing the driver IC 18, described later, are electrically connected to driver input terminals of the driver IC 18 (not shown). Ends of the input lines 13 facing the driver IC 19, described later, are electrically connected to driver input terminals of the driver IC 19 (not shown).

Referring to FIG. 2, ends of the output lines 14 facing the gate electrodes 7 are electrically connected to the gate electrodes 7. Substrate output terminals 14a, 14b, and 14c are provided at ends of the output lines 14 facing the driver IC 17 and are connected to test terminals (not shown) through test terminal lines 14R, 14G, and 14B, respectively. Referring to FIGS. 3 and 4, for example, the substrate output terminals 14a, 14b, and 14c are arranged in rows (extending in the X direction) and columns (extending in the Y direction) and are electrically connected to output terminals 21A, 21B, and 21C, respectively.

In FIG. 3, the output terminals 21A, 21B, and 21C are divided into first terminal groups 121 and second terminal groups 122 that do not overlap the first terminal groups 121 in the column direction (Y direction). In each of the first terminal groups 121, the output terminals 21A, 21B, and 21C are shifted from each other in the row direction (X direction) so that the adjacent output terminals 21A, 21B, and 21C overlap each other in the column direction (Y direction). In each of the second terminal groups 122, the output terminals 21A, 21B, and 21C are shifted from each other in the row direction (X direction) so that the adjacent output terminals 21A, 21B, and 21C overlap each other in the column direction (Y direction).

That is, the adjacent output terminals 21A, 21B, and 21C of each of the terminal groups 121 and 122 are shifted from each other in the row direction so that the ranges of the adjacent output terminals 21A, 21B, and 21C in the row direction overlap each other on a line extending in the column direction from the ranges of the adjacent output terminals 21A, 21B, and 21C in the row direction. In addition, the first terminal groups 121 and the second terminal groups 122 are separated from each other in the row direction so that the output terminals 21A, 21B, and 21C of the second terminal groups 122 are not positioned on a line extending in the column direction from the ranges of the output terminals 21A, 21B, and 21C of the first terminal groups 121 in the row direction.

For example, the output terminals 21A, 21B, and 21C of the first terminal groups 121 and the second terminal groups 122 are arranged in a step pattern. The test terminals are used for a lighting test.

In FIGS. 1 and 2, the output lines 14 are arranged in the direction in which the gate electrodes 7 are arranged, that is, in the X direction. In FIGS. 2 and 3, for example, the output lines 14 connected to the output terminals 21B and 21C of the first terminal groups 121 in the second and subsequent rows extend between the output terminals 21A of the first terminal groups 121 in the first row and the output terminals 21A of the second terminal groups 122 in the first row. The output lines 14 extend linearly in the column direction (in the Y direction in FIG. 3). For example, the output lines 14 connected to the output terminals 21B and 21C of the first terminal groups 121 in the second and subsequent rows extend linearly in the column direction (Y direction) at least between the output terminals 21A of the first terminal groups 121 in the first row and the output terminals 21A of the second terminal groups 122 in the first row. In FIGS. 3 and 4, the output lines 14 are arranged adjacently in the X direction at, for example, intervals Z1. For example, the intervals Z1 between the output lines 14 connected to the substrate output terminals 14a in the first row and the output lines 14 connected to the substrate output terminals 14b in the second row are set to the minimum width possible by photolithography, described later. The output lines 14 have, for example, a width Z2 in the direction in which the output lines 14 are arranged, that is, in the X direction.

The output lines 14 are electrically connected to the substrate output terminals 14a, 14b, and 14c. For example, the output lines 14 connected to the output terminals 21B of the first terminal groups 121 are electrically connected to corners 14L of the output terminals 21B facing the second terminal groups 122 in the row direction (X direction) and facing the gate electrodes 7 in the column direction (Y direction).

In FIG. 3, for example, the substrate output terminals 14a are arranged in the direction in which the output lines 14 are arranged, that is, in the row direction (X direction). In FIG. 4, the substrate output terminals 14a are arranged adjacently in the X direction at, for example, intervals d. For example, the output terminals 21A of the first terminal groups 121 in the first row and the output terminals 21A of the second terminal groups 121 in the first row are arranged at the intervals d. The substrate output terminals 14b and 14c are similarly arranged at the intervals d in the row direction (X direction) in parallel with the row of the substrate output terminals 14a. The substrate output terminals 14a, 14b, and 14c are arranged in N rows (for example, three rows) in the column direction (Y direction), which is perpendicular to the row direction (X direction).

For example, the amount of shift s of the output terminals 21B of the first terminal groups 121 in the second row from the output terminals 21A of the first terminal groups 121 in the first row satisfies the following relationship:

$s=Z1+Z2$ where Z1 is the intervals between the output lines 14 connected to the substrate output terminals 14a of the first terminal groups 121 in the first row and the output lines 14 connected to the substrate output terminals 14b of the first terminal groups 121 in the second row; and Z2 is the width of the output lines 14. The intervals d between the output terminals 21A of the first terminal groups 121 in the first row and the output terminals 21A of the second terminal groups 122 in the first row satisfy the following relationship:

$d \geq (N-1) \times Z2 + N \times Z1$ where N is the number of the substrate output terminals 14a, 14b, and 14c of each of the first terminal groups 121. If the intervals Z1 and the width Z2 are equal, the amount of shift s satisfies the following relationship:

$s=2d/(2N-1)$

In FIG. 4, a first resin layer 22 is formed over the substrate 4 and the output lines 14 so as not to cover regions where the output terminals 21A, 21B, and 21C are disposed. A second resin layer 23 is formed over the first resin layer 22. The output terminals 21A, 21B, and 21C are partially exposed so as to overlap the second resin layer 23.

The test terminal lines 14R, 14G, and 14B, for example, are connected to corners 14K of the substrate output terminals 14a, 14b, and 14c, respectively, opposite the corners 14L thereof and extend linearly away from the output lines 14 in the column direction (Y direction). The test terminal lines 14R, 14G, and 14B are electrically connected to sides of the substrate output terminals 14a, 14b, and 14c, respectively, opposite sides thereof where the output lines 14 are electrically connected, and extend in parallel in the column direction (in the Y direction in FIG. 3).

The test terminal lines 14R, 14G, and 14B are connected to the test terminals (not shown). The test terminals can be connected to terminals of a testing apparatus (not shown) to conduct a lighting test on, for example, the gate electrodes 7 and the source electrodes 8 before the driver IC 17, described later, is mounted.

Referring to FIG. 5, the output lines 15 are provided on the first resin layer 22 formed on the substrate 4 and are electrically connected to, for example, output terminals 24. The second resin layer 23 is formed over the first resin layer 22 and the output lines 15 so as not to cover regions where the output terminals 24 are disposed. The output terminals 24 are partially exposed so as to overlap the second resin layer 23. The output lines 15 and 16, substrate output terminals 15a, 15b, and 15c, test terminal lines 15R, 15G, and 15B, and corners 15L and 15K are similar to the output lines 14, the substrate output terminals 14a, 14b, and 14c, the test terminal lines 14R, 14G, and 14B, and the corners 14L and 14K, respectively, and thus no description will be given thereof.

In FIG. 4, the driver IC 17 includes a substrate 20, driver output terminals 25 disposed on a mounting surface 20a of the substrate 20 opposite the substrate 4, and driver input terminals (not shown).

In FIG. 4, the driver output terminals 25 are, for example, substantially rectangular in cross section and are arranged at positions corresponding to the output terminals 21A, 21B, and 21C in the X and Y directions. The driver output terminals 25 are electrically connected to the output terminals 21A, 21B, and 21C through, for example, an ACF 26 so that the driver output terminals 25 can feed signals supplied through the input lines 11 to the output lines 14 as drive signals to drive the liquid crystal. The driver ICs 18 and 19 are similar to the driver IC 17, and thus no description will be given thereof.

In FIG. 1, the circuit board 3 is electrically connected to the extended portion 4a through, for example, an ACF (not shown). The circuit board 3 includes the flexible base 31, the output lines 32, input lines 33 disposed on the flexible base 31, and a semiconductor IC 34 mounted on the flexible base 31 to control, for example, the driver IC 17. Although not illustrated, other components such as a semiconductor IC serving as a power supply are also mounted on the flexible base 31.

In FIG. 1, the output lines 32 extend in, for example, the Y direction. Ends of the output lines 32 are electrically connected to ends of wiring lines (not shown) provided on the flexible base 31 through connection members provided in through-holes (not shown) formed in the flexible base 31. The other ends of the output lines 32 are electrically connected to output terminals (not shown) of the semiconductor IC 34 through, for example, an ACF.

In FIG. 1, the input lines 33 extend in, for example, the Y direction. Ends of the input lines 33 are electrically connected to input terminals (not shown) of the semiconductor IC 34 through, for example, an ACF. The other ends of the input lines 33 are electrically connected to, for example, an external apparatus (not shown).

Method for Producing Liquid Crystal Device 1

Next, a method for producing the liquid crystal device 1 will be described with reference to the drawings.

Figure 6:
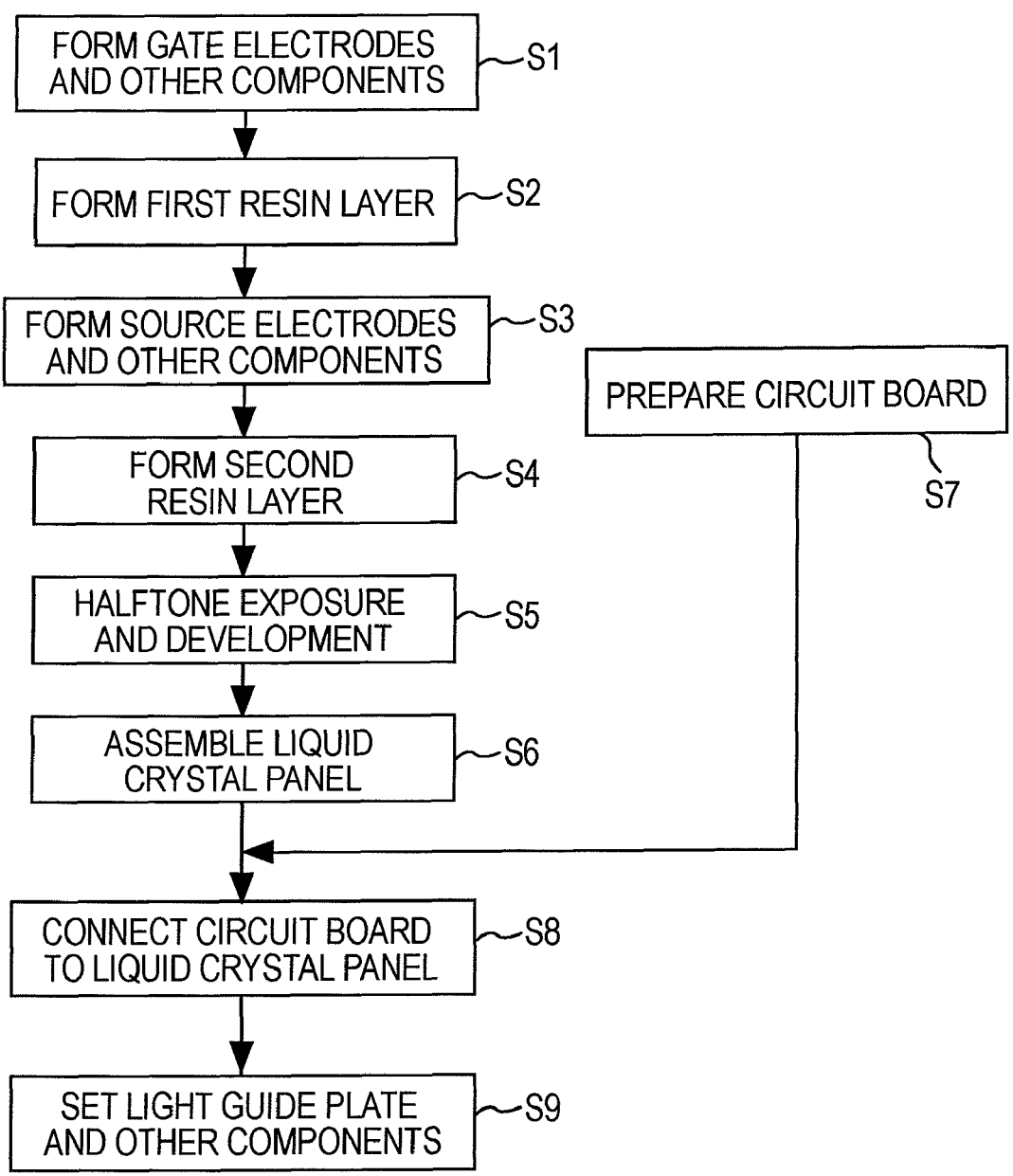
FIG. 6 is a flow chart of a process for producing the liquid crystal device according to the first embodiment.

FIG. 6 is a flow chart of a process for producing the liquid crystal device 1 according to the first embodiment. The description below will focus on steps of preparing the liquid crystal panel 2 (Steps S1 to S6), and no description will be given of a step of preparing the circuit board 3 (Step S7) because the step S7 is similar to the known art.

A metal layer, for example, is formed on a surface of the substrate 4, and a resist layer is formed over the metal layer. These layers are subjected to exposure, development, and etching to form the gate electrodes 7, the output lines 14, and the substrate output terminals 14a, 14b, and 14c on the surface of the substrate 4 (Step S1).

As shown in FIG. 4, for example, the intervals Z1 between the output lines 14 connected to the substrate output terminals 14a in the first row and the output lines 14 connected to the substrate output terminals 14b in the second row are set to the minimum width possible by photolithography.

As shown in FIGS. 3 and 4, the substrate output terminals 14a, 14b, and 14c are formed so that the amount of shift s of the output terminals 21B from the output terminals 21A in the X direction satisfies the following relationship:

$$s = Z1 + Z2$$

and so that the intervals d between the output terminals 21A of the first terminal groups 121 in the first row and the output terminals 21A of the second terminal groups 122 in the first row satisfy the following relationship:

$$d = (N-1) \times Z2 + N \times Z1$$

The test terminal lines 14R, 14G, and 14B are formed so that, for example, they extend in the Y direction and are electrically connected to the sides of the substrate output terminals 14a, 14b, and 14c, respectively, opposite the sides thereof where the output lines 14 are electrically connected. The test terminal lines 14R, 14G, and 14B, for example, extend linearly in the column direction (Y direction) from the corners 14K of the substrate output terminals 14a, 14b, and 14c, respectively, opposite the corners 14L thereof.

The first resin layer 22 is formed over the substrate 4 and the output lines 14 (Step S2; see FIG. 4).

A metal layer is formed on the first resin layer 22, and a resist layer is formed over the metal layer. These layers are subjected to exposure, development, and etching to form the source electrodes 8, the output lines 15, and the substrate output terminals 15a, 15b, and 1c on the first resin layer 22 (Step S3; see FIG. 5).

The second resin layer 23 is formed over the first resin layer 22 and the output lines 15 (Step S4; see FIG. 5).

The first resin layer 22 and the second resin layer 23 are then exposed through a halftone mask that can appropriately adjust the amount of exposure for different positions. In FIGS. 4 and 5, through-holes having different depths where the output terminals 21A, 21B, 21C, and 24, for example, are to be formed are formed in the first resin layer 22 and the second resin layer 23 by development (Step S5).

A metal layer is formed on the second resin layer 23, and a resist layer is formed over the metal layer. These layers are subjected to exposure, development, and etching to form the output terminals 21A, 21B, 21C, which are electrically connected to the substrate output terminals 14a, 14b, 14c, respectively, and to form the output terminals 24, which are electrically connected to the substrate output terminals 15a, 15b, and 15c. In FIGS. 4 and 5, the liquid crystal panel 2 is assembled by, for example, stacking the substrate 5 on top of the substrate 4 with the seal 6 disposed therebetween and injecting a liquid crystal (Step S6).

The circuit board 3, which is prepared in Step S7, is electrically connected to the liquid crystal panel 2 with an ACF (Step S8).

The liquid crystal device 1 is finished after, for example, a light guide plate and a frame (not shown) are set to the liquid crystal panel 2 (Step S9).

The liquid crystal device 1 is thus produced.

According to this embodiment, as described above, the substrate 4 has the output terminals 21A, 21B, and 21C and the output lines 14, which are connected to the output terminals 21A, 21B, and 21C and extend in the column direction. The output terminals 21A, 21B, and 21C are divided into the first terminal groups 121 and the second terminal groups 122. In each of the first terminal groups 121, the output terminals 21A, 21B, and 21C are shifted from each other in the row direction so that the adjacent output terminals 21A, 21B, and 21C overlap each other in the column direction. In each of the second terminal groups 122, the output terminals 21A, 21B, and 21C are shifted from each other in the row direction so that the adjacent output terminals 21A, 21B, and 21C overlap each other in the column direction. This arrangement can facilitate the extension of the output lines 14, reduce the space required therefor in the row direction (X direction) and the column direction (Y direction), and provide, for example, paths through which the ACF 26 flows in the direction indicated by the arrow Q in FIG. 3 along the output terminals 21A, 21B, and 21C during mounting. In addition, the second terminal groups 122 do not overlap the first terminal groups 121 in the column direction (Y direction). This arrangement can further provide paths through which the ACF 26 flows in the column direction (in the direction indicated by the arrow P in FIG. 3) in gaps between the first terminal groups 121 and the second terminal groups 122.

The output lines 14 connected to the output terminals 21B and 21C of the first terminal groups 121 in the second and subsequent rows extend between the output terminals 21A of the first terminal groups 121 in the first row and the output terminals 21A of the second terminal groups 122 in the first row. If, for example, the output terminals 21A, 21B, and 21C are arranged in the row direction, the output lines 14 connected to the output terminals 21B and 21C in the second and subsequent rows can be easily extended in the same direction (for example, in the Y direction) between the output terminals 21A of the first terminal groups 121 in the first row and the output terminals 21A of the second terminal groups 122 in the first row.

The intervals d between the output terminals 21A of the first terminal groups 121 in the first row and the output terminals 21A of the second terminal groups 122 in the first row satisfy the following relationship:

$$d \geq (N-1) \times Z2 + N \times Z1$$

where $Z1$, $Z2$, and $N$ are as defined above. Hence, the output lines 14 can be easily arranged such that the amount of shift s of the output terminals of the first terminal groups 121 in the Nth row from the output terminals of the first terminal groups 121 in the (N−1)th row decreases as the number of the output terminals 21A, 21B, and 21C of each of the first terminal groups 121, namely N, increases. This arrangement can reliably provide intervals between the output terminals 21A, 21B, and 21C and the output lines 14.

If, for example, the output lines 14 of the first terminal groups 121 are arranged at substantially regular intervals in the row direction, the output terminals 21A, 21B, and 21C can be uniformly prevented from obstructing the flow of the ACF 26 when the driver IC 17 is pressed against the substrate 4 with the ACF 26 disposed therebetween. This arrangement allows the ACF 26 to flow smoothly, thus enhancing electrical connection between, for example, the driver output terminals 25 of the driver IC 17 and the output terminals 21A, 21B, and 21C of the substrate 4.

If the width $Z2$ of the output lines 14 is different from the intervals $Z1$, for example, smaller than the intervals $Z1$, a larger number of output terminals can be arranged in the row direction than in the case where the intervals $Z1$ and the width $Z2$ are equal. Thus, the invention can also be applied to the case where the width $Z2$ is different from the intervals $Z1$.

If $Z1$ and $Z2$ are equal, the amount of shift s of the output terminals 21B of the first terminal groups 121 in the second row from the output terminals 21A of the first terminal groups 121 in the first row satisfies the following relationship:

$$s = 2d/(2N-1)$$

Hence, for example, the output lines 14 can be arranged at intervals $Z1$ equal to the width $Z2$ of the output lines 14 such that the amount of shift s of the output terminals 21B of the first terminal groups 121 in the second row from the output terminals 21A of the first terminal groups 121 in the first row decreases as the number of the output terminals 21A, 21B, and 21C of each of the first terminal groups 121, namely N, increases. This arrangement can, for example, reliably prevent a short circuit between the output lines 14.

The output lines 14 connected to the output terminals 21B and 21C of the first terminal groups 121 in the second and subsequent rows extend linearly in the column direction at least between the output terminals 21A of the first terminal groups 121 in the first row and the output terminals 21A of the second terminal groups 122 in the first row. In this case, for example, the length of the output lines 14 can be reduced for lower resistance as compared with the case where the output terminals 21A, 21B, and 21C are arranged in the row direction with the output lines 14 extended obliquely with respect to the row direction. In addition, for example, the ACF 26 can flow smoothly in the column direction when the driver IC 17 is pressed against the substrate 4 with the ACF 26 disposed therebetween, thus enhancing connection between, for example, the driver output terminals 25 and the output terminals 21A, 21B, and 21C.

The output lines 14 connected to the output terminals 21B of the first terminal groups 121 are electrically connected to the corners 14L of the output terminals 21B facing the second terminal groups 122. Accordingly, for example, the output lines 14 connected to the output terminals 21B and 21C of the first terminal groups 121 in the second and subsequent rows can be easily arranged with a smaller amount of shift in the row direction than in the case where the output lines 14 are connected to positions different from the corners 14L of the output terminals 21B facing the second terminal groups 122. This arrangement can thus minimize the amount of shift.

The test terminal lines 14R, 14G, and 14B are electrically connected to the sides of the output terminals 21A, 21B, and 21C, respectively, opposite the sides thereof where the output lines 14 are connected, and extend linearly in the column direction (Y direction). The test terminal lines 14R, 14G, and 14B adjacent in the row direction can therefore be easily extended substantially in parallel in the column direction in the same manner as, for example, the output lines 14 adjacent in the row direction. This arrangement can prevent, for example, a short circuit between the adjacent test terminal lines 14R, 14G, and 14B.

Second Embodiment

A liquid crystal device according to a second embodiment of the invention will be described with reference to the drawings. In the second and subsequent embodiments, the same components as used in the first embodiment are indicated by the same reference numerals, and no description will be given thereof. Also, the liquid crystal devices according to the second and subsequent embodiments are produced by the same method as used in the first embodiment, and thus no description will be given thereof.

Figure 7:
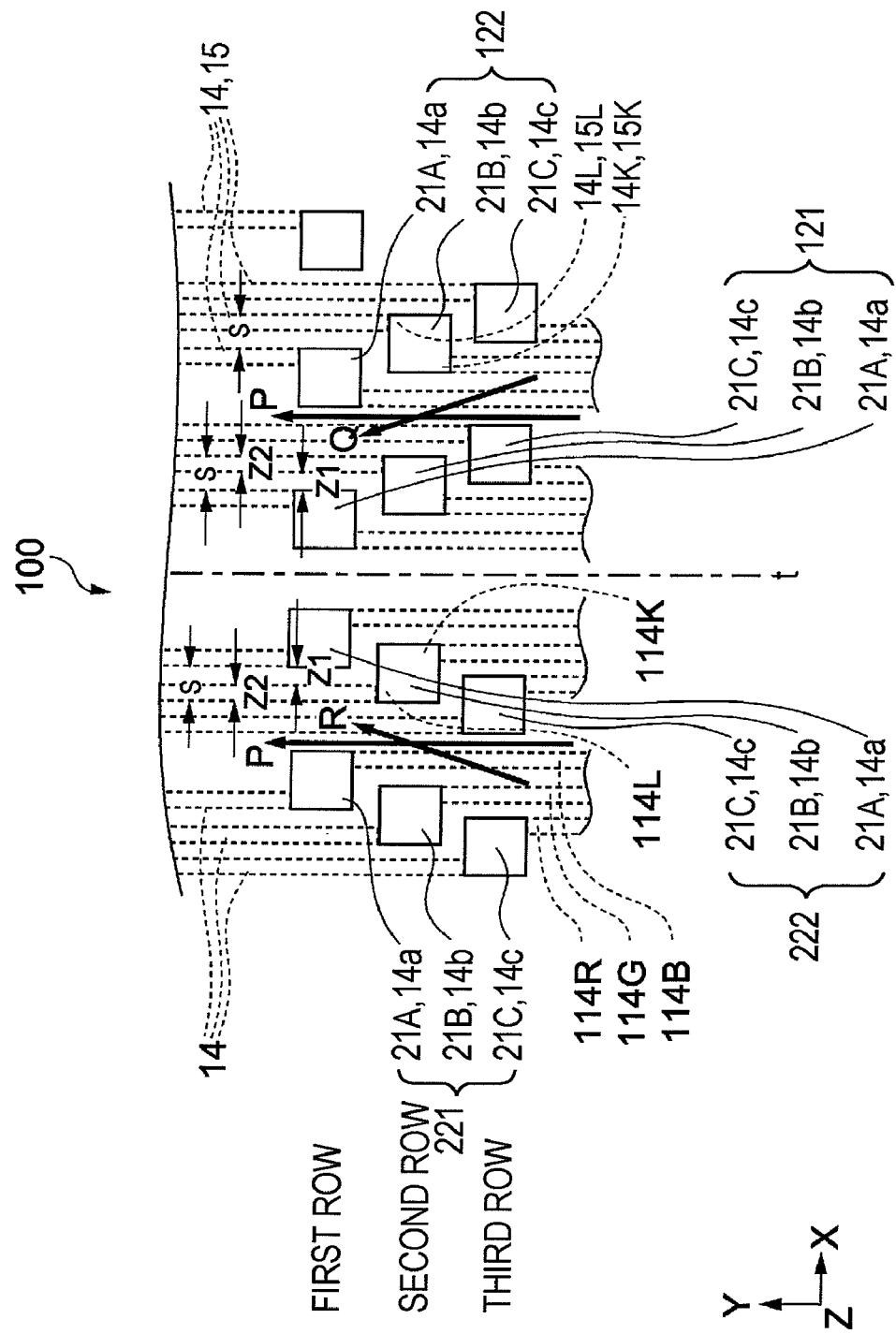
FIG. 7 is a plan view of a liquid crystal device according to a second embodiment of the invention.

FIG. 7 is a plan view of the liquid crystal device according to the second embodiment, illustrating the state of the liquid crystal device before driver ICs are mounted thereon.

A liquid crystal device 100 according to this embodiment is different from the liquid crystal device 1 according to the first embodiment in the positions where the output terminals 21A, 21B, and 21C are disposed on the substrate 4. The description below will focus on the positions where the output terminals 21A, 21B, and 21C are disposed.

In FIG. 7, output terminals 21A, 21B, and 21C disposed on an extended portion 4a in this embodiment are divided into first terminal groups 121, second terminal groups 122, third terminal groups 221, and fourth terminal groups 222. The first terminal groups 121 and the second terminal groups 122 are arranged symmetrically with the fourth terminal groups 222 and the third terminal groups 221, respectively, with respect to a central axis t of the driver IC 17 in the row direction (X direction). The central axis t, for example, extends through a central point (not shown) of the driver IC 17 in a direction (Y direction) perpendicular to the longitudinal direction (X direction) of the driver IC 17.

In each of the third terminal groups 221, the output terminals 21A, 21B, and 21C are shifted from each other in the row direction (X direction) so that the adjacent output terminals 21A, 21B, and 21C overlap each other in the column direction (Y direction). That is, the adjacent output terminals 21A, 21B, and 21C of each of the third terminal groups 221 are shifted from each other in the row direction so that the ranges of the adjacent output terminals 21A, 21B, and 21C in the row direction overlap each other on a line extending in the column direction from the ranges of the adjacent output terminals 21A, 21B, and 21C in the row direction. For example, while the output terminals 21A, 21B, and 21C of the first terminal groups 121 are arranged in a step pattern extending toward the gate electrodes 7 so as to approach the central axis t from the right thereof, the output terminals 21A, 21B, and 21C of the third terminal groups 221 are arranged in a step pattern extending toward the gate electrodes 7 so as to approach the central axis t from the left thereof.

The fourth terminal groups 222 do not overlap the third terminal groups 221 in the column direction (Y direction). In each of the fourth terminal groups 222, the output terminals 21A, 21B, and 21C are shifted from each other in the row direction (X direction) so that the adjacent output terminals 21A, 21B, and 21C overlap each other in the column direction (Y direction). That is, the adjacent output terminals 21A, 21B, and 21C of each of the fourth terminal groups 222 are shifted from each other in the row direction so that the ranges of the adjacent output terminals 21A, 21B, and 21C in the row direction overlap each other on a line extending in the column direction from the ranges of the adjacent output terminals 21A, 21B, and 21C in the row direction. For example, while the output terminals 21A, 21B, and 21C of the second terminal groups 122 are arranged in a step pattern extending toward the gate electrodes 7 so as to approach the central axis t from the right thereof, the output terminals 21A, 21B, and 21C of the fourth terminal groups 222 are arranged in a step pattern extending toward the gate electrodes 7 so as to approach the central axis t from the left thereof.

In FIG. 7, for example, output lines 14 connected to the output terminals 21B and 21C of the fourth terminal groups 222 in the second and subsequent rows extend between the output terminals 21A of the third terminal groups 221 in the first row and the output terminals 21A of the fourth terminal groups 222 in the first row. For example, the output lines 14 connected to the output terminals 21B and 21C of the fourth terminal groups 222 in the second and subsequent rows extend linearly in the column direction (Y direction) at least between the output terminals 21A of the third terminal groups 221 in the first row and the output terminals 21A of the fourth terminal groups 222 in the first row. In FIG. 7, the output lines 14 are arranged adjacently in the X direction at, for example, intervals Z1. For example, the intervals Z1 between the output lines 14 connected to the substrate output terminals 14a in the first row and the output lines 14 connected to the substrate output terminals 14b in the second row are set to the minimum width possible by photolithography. The output lines 14 have, for example, a width Z2 in the direction in which the output lines 14 are arranged, that is, in the X direction.

For example, the output lines 14 connected to the output terminals 21B of the fourth terminal groups 222 are electrically connected to corners 114L of the output terminals 21B facing the third terminal groups 221 in the row direction (X direction) and facing the gate electrodes 7 in the column direction (Y direction).

For example, the output terminals 21A of the third terminal groups 221 in the first row and the output terminals 21A of the fourth terminal groups 222 in the first row are arranged at the intervals d. Substrate output terminals 14a, 14b, and 14c are arranged in N rows (for example, three rows) in the column direction (Y direction), which is perpendicular to the row direction (X direction).

For example, the amount of shift s of the output terminals 21B of the fourth terminal groups 222 in the second row from the output terminals 21A of the fourth terminal groups 222 in the first row satisfies the following relationship:

$$s = Z1 + Z2$$

where Z1 is the intervals between the output lines 14 connected to the substrate output terminals 14a of the fourth terminal groups 222 in the first row and the output lines 14 connected to the substrate output terminals 14b of the fourth terminal groups 222 in the second row; and Z2 is the width of the output lines 14. The intervals d between the output terminals 21A of the third terminal groups 221 in the first row and the output terminals 21A of the fourth terminal groups 222 in the first row satisfy the following relationship:

$$d \geq (N-1) \times Z2 + N \times Z1$$

where N is the number of the substrate output terminals 14a, 14b, and 14c of each of the fourth terminal groups 222. If the intervals Z1 and the width Z2 are equal, the amount of shift s satisfies the following relationship:

$$s = 2d/(2N-1)$$

Test terminal lines 114R, 114G, and 114B, for example, are connected to corners 114K of the substrate output terminals 14a, 14b, and 14c, respectively, opposite the corners 114L thereof and extend linearly away from the output lines 14 in the column direction (Y direction). The test terminal lines 114R, 114G, and 114B are electrically connected to sides of the substrate output terminals 14a, 14b, and 14c, respectively, opposite sides thereof where the output lines 14 are electrically connected, and extend in parallel in the column direction (in the Y direction in FIG. 7).

According to this embodiment, the output terminals 21A, 21B, and 21C, which are used to mount the driver IC 17, are divided into the first terminal groups 121, the second terminal groups 122, the third terminal groups 221, and the fourth terminal groups 222. The first terminal groups 121 and the second terminal groups 122 are arranged symmetrically with the fourth terminal groups 222 and the third terminal groups 221, respectively, with respect to the central axis t of the driver IC 17 in the row direction (X direction). For example, when the driver IC is mounted on the substrate 4 by pressing the driver IC using a pressing head, an adhesive such as an ACF flows in the column direction (in the direction indicated by the arrows P of FIG. 7) between the first terminal groups 121 and the second terminal groups 122 and between the third terminal groups 221 and the fourth terminal groups 222. The adhesive also flows, for example, in a direction along the output terminals 21A, 21B, and 21C of the first terminal groups 121 (in the direction indicated by the arrow Q) between the first terminal groups 121 and the second terminal groups 122 and in a direction along the output terminals 21A, 21B, and 21C of the fourth terminal groups 222 (in the direction indicated by the arrow R) between the third terminal groups 221 and the fourth terminal groups 222. The arrangement described above can therefore more reliably prevent, for example, misalignment of the driver IC 17 due to unevenness in the direction in which the adhesive flows than in the case where all output terminals 21A, 21B, and 21C are divided into only the first terminal groups 121 and the second terminal groups 122. The driver IC 17 can thus be aligned more accurately.

First Modification

A liquid crystal device according to a first modification of the invention will be described with reference to the drawings. The liquid crystal device according to this modification is produced by the same method as used in the first embodiment, and thus no description will be given thereof.

Figure 8:
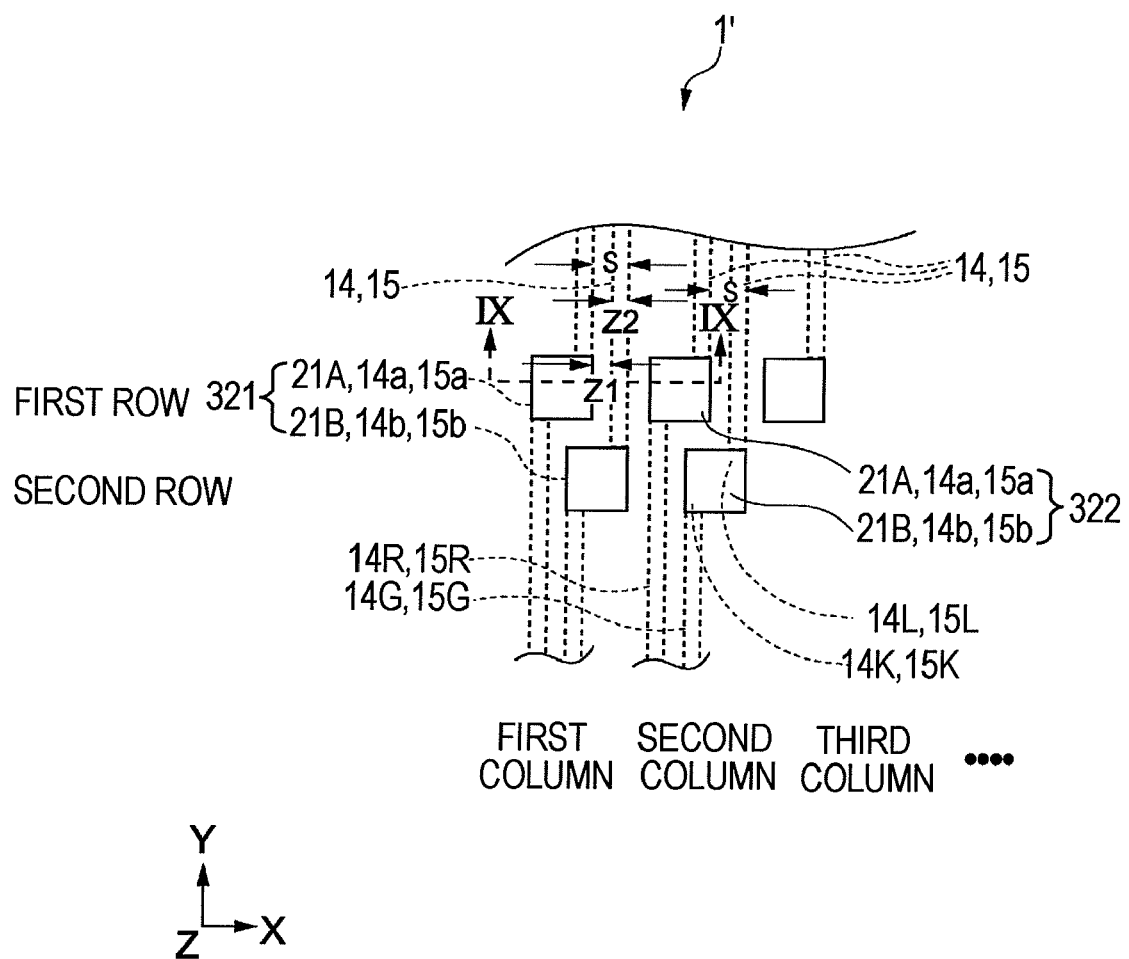
FIG. 8 is a plan view of output terminals of a liquid crystal device according to a first modification of the invention.
Figure 9:
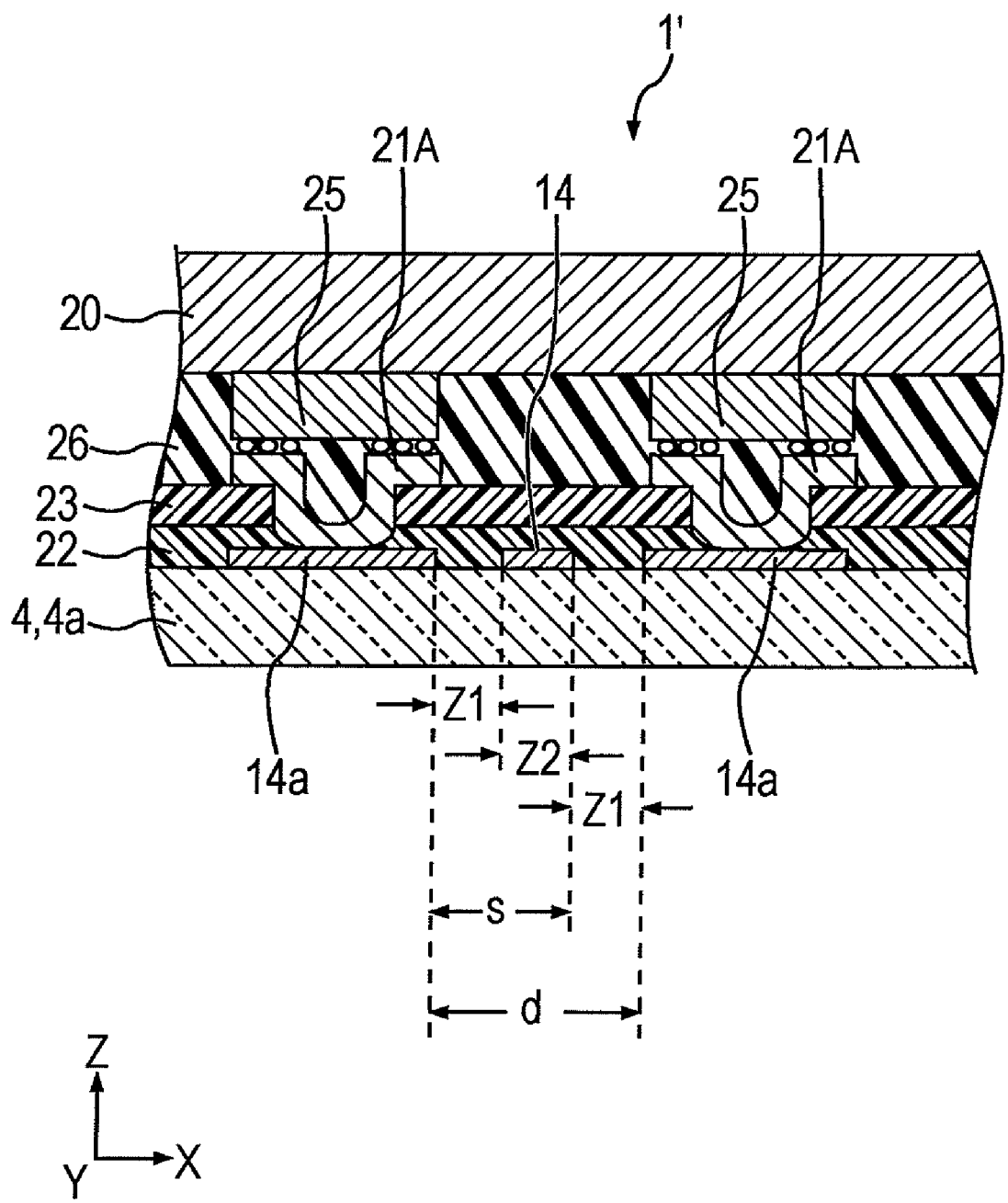
FIG. 9 is a sectional view taken along line IX-IX of FIG. 8.

FIG. 8 is a plan view of output terminals of the liquid crystal device according to the first modification. FIG. 9 is a sectional view taken along line IX-IX of FIG. 8. FIG. 8 illustrates the state of the liquid crystal device before driver ICs are mounted thereon.

In FIG. 8, a liquid crystal device 1' according to this modification includes substrate output terminals 14a and 14b arranged in two rows (in the Y direction) and a plurality of columns (in the X direction).

In FIG. 8, output terminals 21A and 21B are divided into first terminal groups 321 and second terminal groups 322 that do not overlap the first terminal groups 321 in the column direction (Y direction). In each of the first terminal groups 321, the output terminals 21A and 21B are shifted from each other in the row direction (X direction) so that the adjacent output terminals 21A and 21B overlap each other in the column direction (Y direction). In each of the second terminal groups 322, the output terminals 21A and 21B are shifted from each other in the row direction (X direction) so that the adjacent output terminals 21A and 21B overlap each other in the column direction (Y direction).

That is, the adjacent output terminals 21A and 21B of each of the terminal groups 321 and 322 are shifted from each other in the row direction so that the ranges of the adjacent output terminals 21A and 21B in the row direction overlap each other on a line extending in the column direction from the ranges of the adjacent output terminals 21A and 21B in the row direction. In addition, the first terminal groups 321 and the second terminal groups 322 are separated from each other in the row direction so that the output terminals 21A and 21B of the second terminal groups 322 are not positioned on a line extending in the column direction from the ranges of the output terminals 21A and 21B of the first terminal groups 321 in the row direction.

In FIG. 8, for example, output lines 14 connected to the output terminals 21B of the first terminal groups 321 in the second row extend between the output terminals 21A of the first terminal groups 321 in the first row and the output terminals 21A of the second terminal groups 322 in the first row.

In FIG. 8, for example, the substrate output terminals 14a are arranged in the direction in which the output lines 14 are arranged, that is, in the row direction (X direction). In FIG. 9, the substrate output terminals 14a are arranged adjacently in the X direction at, for example, intervals d. The output lines 14 connected to the output terminals 21B in the second row extend in the Y direction between the substrate output terminals 14a arranged adjacently in the X direction (for example, one output line 14 extends through each of the intervals between the substrate output terminals 14a). The substrate output terminals 14b are similarly arranged at the intervals d in the row direction (X direction) in parallel with the row of the substrate output terminals 14a. The substrate output terminals 14a and 14b are arranged in, for example, two rows in the column direction (Y direction), which is perpendicular to the row direction (X direction), such that they are shifted from each other in the row direction (X direction) by an amount of shift s.

According to this modification, as described above, the output terminals 21A and 21B are divided into the first terminal groups 321 and the second terminal groups 322. In each of the first terminal groups 321, the output terminals 21A and 21B are shifted from each other in the row direction so that the adjacent output terminals 21A and 21B overlap each other in the column direction. In each of the second terminal groups 322, the output terminals 21A and 21B are shifted from each other in the row direction so that the adjacent output terminals 21A and 21B overlap each other in the column direction. This arrangement can facilitate the extension of the output lines 14, reduce the space required therefor in the column direction (Y direction) and the row direction (X direction), and provide, for example, paths through which an ACF flows in a direction along the output terminals 21A and 21B of the first terminal groups 121 during mounting. In addition, the second terminal groups 322 do not overlap the first terminal groups 321 in the column direction (Y direction). This arrangement can further provide paths through which the ACF flows in the column direction (Y direction) between the first terminal groups 321 and the second terminal groups 322.

For example, the amount of shift s of the output terminals 21B of the first terminal groups 321 in the second row from the output terminals 21A of the first terminal groups 321 in the first row satisfies the following relationship:

$$s = Z1 + Z2$$

where Z1 is the intervals between the output lines 14 connected to the substrate output terminals 14a of the first terminal groups 321 in the first row and the output lines 14 connected to the substrate output terminals 14b of the first terminal groups 321 in the second row; and Z2 is the width of the output lines 14. The intervals d between the output terminals 21A of the first terminal groups 321 in the first row and the output terminals 21A of the second terminal groups 322 in the first row satisfy the following relationship:

$$d \geq (N-1) \times Z2 + N \times Z1$$

where N is the number of the substrate output terminals 14a and 14b of each of the first terminal groups 321. Hence, the output lines 14 can be easily extended such that the amount of shift s decreases as the number of rows of the output terminals 14a and 14b arranged in the column direction (Y direction), namely N, increases. This arrangement can reliably provide intervals between the output terminals 21A and 21B and the output lines 14.

For example, because the amount of shift s and the intervals d satisfy the relationships described above, the output lines 14 of the first terminal groups 321 can be arranged at substantially regular intervals in the X direction. When, for example, a driver IC 20 is pressed against the substrate 4 with an ACF 26 disposed therebetween, the ACF 26 can flow smoothly, thus enhancing electrical connection between, for example, driver output terminals 25 of the driver IC 20 and the output terminals 21A, 21B, and 21C.

Second Modification

A liquid crystal device according to a second modification of the invention will be described with reference to the drawings.

Figure 10:
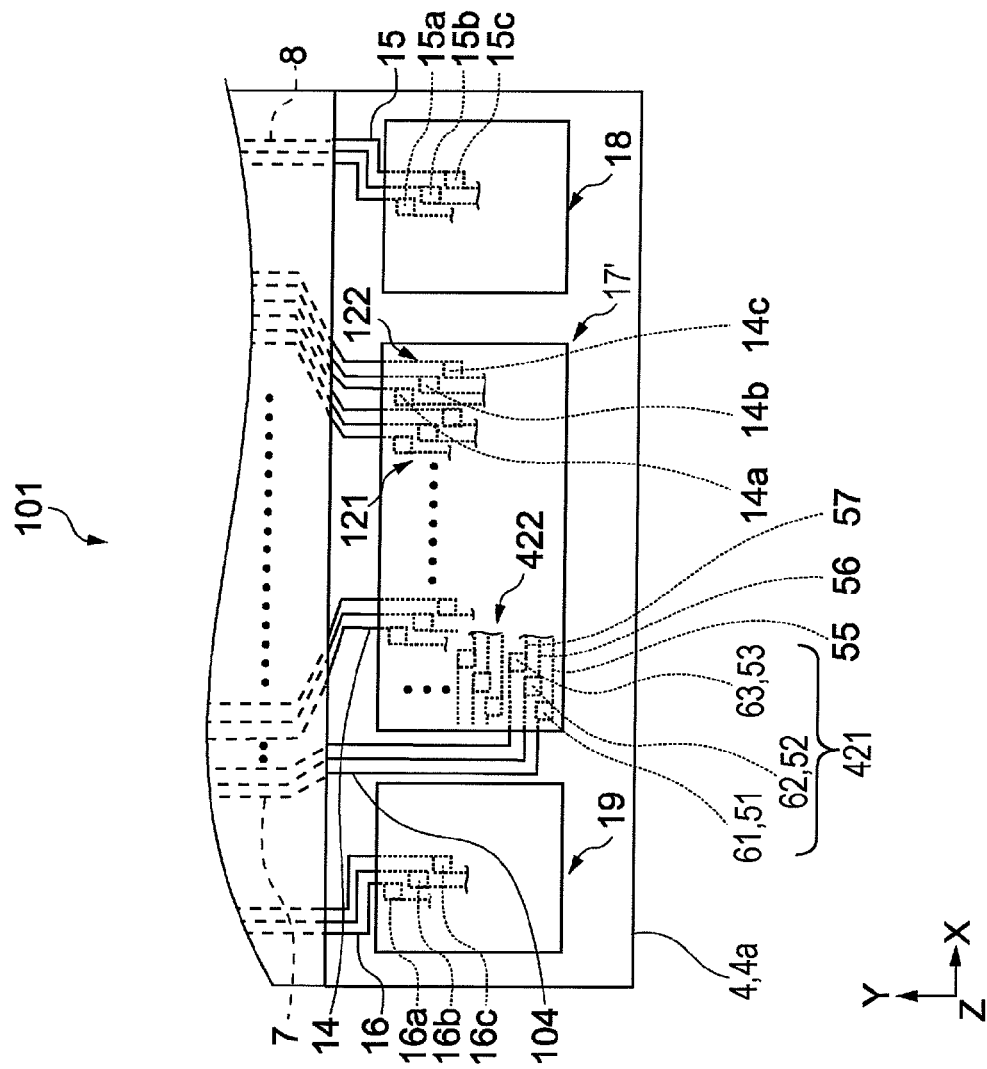
FIG. 10 is a plan view of output terminals of a liquid crystal device according to a second modification of the invention.

FIG. 10 is a plan view of output terminals of the liquid crystal device according to the second modification.

In FIG. 10, a liquid crystal device 101 according to this modification not only include first terminal groups 121 and second terminal groups 122 similar to those in the first embodiment, but also include third terminal groups 421 and fourth terminal groups 422 that are, for example, arranged in the Y direction, that is, in a direction perpendicular to a direction in which the first terminal groups 121 and the second terminal groups 122 are arranged.

In FIG. 10, output terminals 61, 62, and 63 are divided into the third terminal groups 421 and the fourth terminal groups 422, which do not overlap the third terminal groups 421 in the column direction (X direction). In each of the third terminal groups 421, the output terminals 61, 62, and 63 are shifted from each other in the row direction (Y direction) so that the adjacent output terminals 61, 62, and 63 overlap each other in the column direction (X direction). In each of the fourth terminal groups 422, the output terminals 61, 62, and 63 are shifted from each other in the row direction (Y direction) so that the adjacent output terminals 61, 62, and 63 overlap each other in the column direction (X direction). That is, the adjacent output terminals 61, 62, and 63 of each of the terminal groups 421 and 422 are shifted from each other in the row direction so that the ranges of the adjacent output terminals 61, 62, and 63 in the row direction overlap each other on a line extending in the column direction from the ranges of the adjacent output terminals 61, 62, and 63 in the row direction. In addition, the third terminal groups 421 and the fourth terminal groups 422 are separated from each other in the row direction so that the output terminals 61, 62, and 63 of the fourth terminal groups 422 are not positioned on a line extending in the column direction from the ranges of the output terminals 61, 62, and 63 of the third terminal groups 421 in the row direction. Output lines connected to the fourth terminal groups 422 are not illustrated.

In FIG. 10, ends of output lines 104 facing gate electrodes 7 are electrically connected to the gate electrodes 7. The output lines 104, for example, extend between driver ICs 17' and 19 in the row direction (Y direction). Substrate output terminals 51, 52, and 53 are provided at ends of the output lines 104 facing the driver IC 17' and are connected to test terminals (not shown) through test terminal lines 55, 56, and 57, respectively. The substrate output terminals 51, 52, and 53 are electrically connected to output terminals 61, 62, and 63, respectively.

In FIG. 10, the output terminals 61, 62, and 63, the substrate output terminals 51, 52, and 53, and the test terminal lines 55, 56, and 57 are arranged in the Y direction, that is, in a direction perpendicular to the direction in which output terminals 14A, 14B, and 14C, substrate output terminals 14a, 14b, and 14c, and test terminal lines 14R, 14G, and 14B similar to those in the first embodiment are arranged, although they are arranged substantially in the same manner.

For example, the output terminals 61, 62, and 63 are electrically connected to driver output terminals (not shown) arranged on the driver IC 17' in the X and Y directions through an ACF (not shown). These driver output terminals are disposed at positions corresponding to the output terminals 61, 62, and 63 in a mounting surface of a substrate.

According to this modification, as described above, the substrate 4 has the output terminals 61, 62, and 63, which are divided into the third terminal groups 421 and the fourth terminal groups 422. In each of the third terminal groups 421, the output terminals 61, 62, and 63 are shifted from each other in the row direction so that the adjacent output terminals 61, 62, and 63 overlap each other in the column direction. In each of the fourth terminal groups 422, the output terminals 61, 62, and 63 are shifted from each other in the row direction so that the adjacent output terminals 61, 62, and 63 overlap each other in the column direction. This arrangement can facilitate the extension of the output lines 104, reduce the space required therefor in the column direction (X direction) and the row direction (Y direction), and provide, for example, paths through which the ACF flows in a direction along the output terminals 61, 62, and 63 of the third terminal groups 421 during mounting. In addition, the fourth terminal groups 422 do not overlap the third terminal groups 421 in the column direction. This arrangement can further provide paths through which the ACF flows in the column direction (X direction) between the third terminal groups 421 and the fourth terminal groups 422.

The output terminals 61, 62, and 63 (substrate output terminals 51, 52, and 53) are arranged in three rows (in the X direction) and a plurality of columns (in the Y direction) and are electrically connected to the driver output terminals through the ACF. If, for example, the driver IC 17' is mounted on the substrate 4, the output lines 104 can be easily arranged such that the amount of shift s in the row direction (Y direction) decreases as the number of rows of the output terminals arranged in the X direction, namely N, increases. This arrangement can reliably provide intervals between the output terminals 61, 62, and 63 and the output lines 104.

The output terminals 61, 62, and 63 (substrate output terminals 51, 52, and 53) are arranged in three rows (in the X direction) and a plurality of columns (in the Y direction) so that, for example, the ACF can flow smoothly both in the Y direction and in the X direction when the driver IC 17' is pressed against the substrate 4 with the ACF disposed therebetween. This enhances electrical connection between, for example, the driver output terminals of the driver IC 17' and the output terminals 61, 62, and 63.

Third Embodiment: Electronic Apparatus

An electronic apparatus according to a third embodiment of the invention will be described. This electronic apparatus includes the liquid crystal device 1 described above. In this embodiment, the same components as used in the first embodiment are indicated by the same reference numerals, and no description will be given thereof.

FIG. 11 is a block diagram of the overall structure of a display control system of the electronic apparatus according to the third embodiment.

In FIG. 11, an electronic apparatus 300 has a display control system including, for example, a liquid crystal panel 2 and a display control circuit 390. The display control circuit 390 includes, for example, a display information output source 391, a display information processing circuit 392, a power supply circuit 393, and a timing generator 394. The liquid crystal panel 2 includes a drive circuit 361 for driving a display region I.

The display information output source 391 includes a memory such as a read-only memory (ROM) or a random access memory (RAM), a storage unit such as a magnetic recoding disc or an optical recoding disc, and a tuning circuit for tuning and outputting digital image signals. The display information output source 391 feeds display information to the display information processing circuit 392 in the form of, for example, image signals in a predetermined format according to clock signals generated by the timing generator 394.

The display information processing circuit 392 includes various known circuits such as a serial/parallel conversion circuit, an amplifier/inverter circuit, a rotation circuit, a gamma correction circuit, and a clamping circuit. This display information processing circuit 392 processes the display information to feed image information to the drive circuit 361 together with clock signals CLK. The power supply circuit 393 supplies a predetermined voltage to the individual components.

The electronic apparatus 300 can provide excellent electrical connection reliability because it includes the liquid crystal device 1, which facilitates the extension of the output lines 14 connected to the substrate output terminals 14a, 14b, and 14c and allows the ACF 26 to flow smoothly when the driver IC 17 is pressed.

Examples of electronic apparatuses having a liquid crystal display unit include cellular phones, personal computers, touch panels, projectors, liquid crystal television sets, camcorders having a view finder or a monitor, car navigation systems, pagers, electronic organizers, calculators, word processors, work stations, video phones, and POS terminals. The liquid crystal device 1, for example, can of course be used as a display unit for such electronic apparatuses.

Electrooptical devices and electronic apparatuses according to embodiments of the invention are not limited to the examples described above. Various modifications and combinations of the embodiments described above are of course permitted without departing from the spirit of the invention.

Although TFT active-matrix liquid crystal devices are used in the above embodiments, the invention is not limited thereto and may also be applied to other types of liquid crystal devices, including thin-film-diode active-matrix liquid crystal devices and passive-matrix liquid crystal devices. In addition, the invention may be applied to any of transflective liquid crystal devices, reflective liquid crystal devices, and transmissive liquid crystal devices.

Although a chip-on-glass (COG) technique is used in the embodiments described above, the invention is not limited thereto, and other techniques such as a chip-on-film (COF) technique and outer lead bonding (OLB) may also be used.

What is claimed is:

1. An electro-optical device, comprising:
    a substrate having terminals and wiring lines arranged thereon,
        the wiring lines being connected to the terminals and extending in a first direction,
        the terminals being divided into at least one first terminal group and at least one second terminal group that does not overlap the first terminal group in the first direction,
        each of the first and second terminal groups having at least three terminals that do not overlap each other in plane view,
        each terminal of the first and second terminal groups having a width in a second direction that intersects the first direction,
        in each pair of adjacent terminals in each of the first and second terminal groups, one of the adjacent terminals having a first portion and a second portion, the first portion overlapping the width of the other terminal in the first direction, the second portion being located without overlapping the width of the other terminal in the first direction, one of the wiring lines being connected to the second portion; and
    an electronic component mounted on the substrate with an adhesive;
    wherein
    the wiring lines connected to the second portions of the terminals of the first terminal group extend between a first terminal of the first terminal group and a first terminal of the second terminal group;
    the wiring lines connected to the second portions of the terminals of the first terminal group extend linearly in the first direction at least between the first terminal of the first terminal group and the first terminal of the second terminal group; and
    the electro-optical device further comprises:
    second wiring lines extending in the first direction and electrically connected to the first portions of the terminals of the first and second terminal groups at sides opposite to where the wiring lines are electrically connected to the respective second portions.

2. The electro-optical device according to claim 1, satisfying the following relationship:

$$d \geq (N-1) \times Z2 + N \times Z1$$

wherein
    Z1 is an interval between adjacent ones of the wiring lines connected to the second portions of the terminals of the first terminal group;
    Z2 is a width of each of the wiring lines in the second direction;
    N is the number of the terminals of the first terminal group; and
    d is an interval between the first terminal of the first terminal group and the first terminal of the second terminal group.

3. The electro-optical device according to claim 2, wherein Z1 and Z2 are equal,
    the electro-optical device satisfying the following relationship:

$$s = 2d/(2N-1)$$

wherein
    s is a dimension in the second direction of the second portion of the terminals of the first and second terminal groups.

4. The electro-optical device according to claim 1, wherein
    the second portions of the terminals of the first terminal group include corners of the terminals of the first terminal group facing the second terminal group; and
    the wiring lines are electrically connected to said corners of the terminals of the first terminal group.

5. A mounting assembly, comprising an electro-optical device according to claim 1.

6. A method of producing an electro-optical device, said method comprising:
    forming terminals and wiring lines on a substrate,
        the wiring lines being connected to the terminals and extending in a first direction,
        the terminals being divided into at least one first terminal group and at least one second terminal group that does not overlap the first terminal group in the first direction,
        each of the first and second terminal groups having at least three terminals that do not overlap each other in plane view,
        each terminal of the first and second terminal groups having a width in a second direction that intersects the first direction,
        in each pair of adjacent terminals in each of the first and second terminal groups, one of the adjacent terminals having a first portion and a second portion, the first portion overlapping the width of the other terminal in the first direction, the second portion being located without overlapping the width of the other terminal in the first direction, one of the wiring lines being connected to the second portion;
    wherein the wiring lines connected to the second portions of the terminals of the first terminal group extend between a first terminal of the first terminal group and first terminal of the second terminal group;

the wiring lines connected to the second portions of the terminals of the first terminal group extend linearly in the first direction at least between the first terminal of the first terminal group and the first terminal of the second terminal group; and second wiring lines are further formed to extend in the first direction and to be electrically connected to the first portions of the terminals of the first and second terminal groups at sides opposite to where the wiring lines are electrically connected to the respective second portions; and mounting an electronic component on the substrate by pressing the electronic component against the substrate with an adhesive disposed therebetween.

7. The method according to claim 6, wherein an interval between adjacent ones of the wiring lines connected to the terminals of the first terminal group is set to the minimum width possible by photolithography.

8. An electronic apparatus, comprising the electro-optical device according to claim 1.

9. An electro-optical device, comprising:

a substrate having terminals arranged thereon and wiring lines connected to the terminals and extending in a column direction, the terminals being divided into at least one first terminal group and at least one second terminal group that does not overlap the first terminal group in the column direction, the terminals of the first terminal group being shifted from each other in a row direction so that the adjacent terminals overlap each other in the column direction, the terminals of the second terminal group being shifted from each other in the row direction so that the adjacent terminals overlap each other in the column direction; and an electronic component mounted on the substrate with an adhesive;

wherein the wiring lines connected to the terminals of the first terminal group in second and subsequent rows extend between the terminal of the first terminal group in a first row and the terminal of the second terminal group in the first row;

said electro-optical device satisfying the following relationship:

$$d \geq (N-1) \times Z2 + N \times Z1$$

where

Z1 is an interval between the wiring lines connected to the terminals of the first terminal group in the first and second rows;

Z2 is the width of the wiring lines;

N is the number of the terminals of the first terminal group; and d is an interval between the terminal of the first terminal group in the first row and the terminal of the second terminal group in the first row;

wherein the wiring lines connected to the terminals of the first terminal group in the second and subsequent rows extend linearly in the column direction at least between the terminal of the first terminal group in the first row and the terminal of the second terminal group in the first row; and the electro-optical device further comprises:

second wiring lines extending in the column direction and electrically connected to the terminals at sides opposite to where the wiring lines are electrically connected.

10. The electro-optical device according to claim 9, wherein Z1 and Z2 are equal, the electro-optical device satisfying the following relationship:

$$s = 2d/(2N-1)$$

where s is the amount of shift of the terminal of the first terminal group in the second row from the terminal of the first terminal group in the first row.

11. The electro-optical device according to claim 9, wherein the wiring lines connected to the terminals of the first terminal group are electrically connected to corners of the terminals of the first terminal group facing the second terminal group.

12. A mounting assembly, comprising an electro-optical device according to claim 9.

13. An electronic apparatus, comprising the electro-optical device according to claim 9.

* * * * *